(12) United States Patent
Miyata

(10) Patent No.: US 7,453,700 B2
(45) Date of Patent: Nov. 18, 2008

(54) DISPLAY DEVICE

(75) Inventor: Kazuhiko Miyata, Habikino (JP)

(73) Assignee: Sharp Kabushiki Kaisha, Osaka (JP)

( * ) Notice: Subject to any disclaimer, the term of this patent is extended or adjusted under 35 U.S.C. 154(b) by 356 days.

(21) Appl. No.: 10/554,077

(22) PCT Filed: Feb. 20, 2004

(86) PCT No.: PCT/JP2004/002033

§ 371 (c)(1),
(2), (4) Date: Oct. 21, 2005

(87) PCT Pub. No.: WO2004/097769

PCT Pub. Date: Nov. 11, 2004

(65) Prior Publication Data

US 2006/0193117 A1    Aug. 31, 2006

(30) Foreign Application Priority Data

Apr. 25, 2003  (JP) .............................. 2003-122850

(51) Int. Cl.
*H05K 1/00* (2006.01)
(52) U.S. Cl. .................. 361/749; 361/748; 361/750; 361/760; 361/789
(58) Field of Classification Search ......... 361/748–750, 361/760, 789; 349/60, 149–152
See application file for complete search history.

(56) References Cited

U.S. PATENT DOCUMENTS 5,598,178 A * 1/1997 Kawamori ................ 345/93
5,742,279 A   4/1998 Yamamoto et al.
5,798,740 A * 8/1998 Bitzakidis et al. ............ 345/92
6,040,825 A   3/2000 Yamamoto et al.

(Continued)

FOREIGN PATENT DOCUMENTS

JP      08-214355      8/1996

(Continued)

OTHER PUBLICATIONS

Ri et al.; "Forming a 3-MHz- Operated MPU on a Glass Substrate;" Nikkei Electronics; Feb. 17, 2003; p. 123-130.

*Primary Examiner*—Dean A. Reichard
*Assistant Examiner*—Hoa C Nguyen
(74) *Attorney, Agent, or Firm*—Keating & Bennett, LLP

(57) ABSTRACT

A display device is arranged such that a voice device (2) is laminated on a liquid crystal panel (1) so as to be confined in a planar area of the liquid crystal panel (1), and a voice-system circuit block which drives the voice device (2) is formed on the thin film substrate (10) of the liquid crystal panel (1). A signal is inputted into the voice-system circuit block through an FPC (4) which is connected to the thin film substrate (10) and which inputs a video signal, and the signal processed at the voice-system circuit block is conducted through the FPC (4). A connecting terminal part (4a) is provided in a middle portion of the FPC (4) and adhered to an FPC (5). One end of the FPC (5) is connected to the voice device (2). In this way, a multifunctional display device can be achieved at low cost by efficiently using a limited space around the display element without sacrificing the advantages of a lightweight and thin-shaped flat display device.

12 Claims, 18 Drawing Sheets

U.S. PATENT DOCUMENTS

| | | | |
|---|---|---|---|
| 6,307,751 B1 * | 10/2001 | Bodony et al. | 361/749 |
| 2002/0033911 A1 * | 3/2002 | Ishida et al. | 349/74 |
| 2002/0164475 A1 * | 11/2002 | Imamura et al. | 428/325 |
| 2003/0011735 A1 * | 1/2003 | Kato | 349/149 |
| 2003/0016508 A1 * | 1/2003 | Kurumisawa | 361/749 |
| 2003/0020401 A1 * | 1/2003 | Park et al. | 313/512 |
| 2003/0063041 A1 | 4/2003 | Kurashima et al. | |
| 2003/0197813 A1 * | 10/2003 | Nakanishi et al. | 349/12 |
| 2004/0090584 A1 * | 5/2004 | Mai | 349/149 |

FOREIGN PATENT DOCUMENTS

| | | |
|---|---|---|
| JP | 2001-168546 | 6/2001 |
| JP | 2002-148653 | 5/2002 |
| JP | 2002-297050 | 10/2002 |
| JP | 2003-007564 | 1/2003 |
| JP | 2003-029288 | 1/2003 |
| TW | 519582 B | 2/2003 |

* cited by examiner

DISPLAY DEVICE

TECHNICAL FIELD

The present invention relates to a display device and more particularly to a display device suitable for use as a small-size, lightweight, and thin-shaped display device such as a portable display device.

BACKGROUND ART

Recently, a small-size, lightweight, and thin-shaped display element has become available, and through use of a display element, a portable display device has been commercialized which imports an image from an external device and displays the image. Not only a portable display device but also a display device using such a display element are required to be about as close as possible to the same size possible as a display section of the display device, and hence a size of a frame section of the display device is under very tight limitations.

The frame section is a section which is provided around the display section of the display device and does not contribute to display. The display device includes the element (hereinafter referred to as "display element") having a display function, which display element forms the display section. Provided around the display section is a terminal part or the like, which terminal part is for inputting a signal into the display section. When the display device is formed, the display element is incorporated into such a section that does not contribute to display, the section is covered by a bezel.

In order to provide the functions of a speaker (sound source element), a microphone (sound collection element), and the like, a conventional portable display device needs to separately include, in addition to the display element, an element (voice element) having a voice function.

Today, such a portable display device is being commercialized as a very easily portable card-like display device that is about the same size as a normal credit card or business card.

"Nikkei Electronics (Feb. 17, 2003) p. 123-130" describes a technique of forming an 8-bit microprocessor on a glass substrate. According to this technique, a continuous grain boundary crystal silicon (hereinafter referred to as "CG silicon") technique is used to form on a glass substrate a thin film layer containing CG silicon. As compared with low-temperature polycrystalline silicon, CG silicon has large crystal grains with regular boundaries therebetween. Because CG silicon has a high electron transfer degree of 200 to 300 $cm^2/Vs$, it allows a logic circuit to operate at high speeds. By using this technique, a microprocessor can be incorporated into substrates sandwiching liquid crystal.

Meanwhile, Japanese Unexamined Patent Publication No. 29288/2003 (Tokukai 2003-29288; published on Jan. 29, 2003) describes a display device including: an FPC (liquid crystal panel FPC) for a liquid crystal panel; and an FPC (heater FPC) for a heater designed to warm up the liquid crystal panel, wherein the heater FPC is connected to the liquid crystal panel FPC in advance so as to decrease the number of operations required to form electrical connections.

However, as described above, the conventional portable display device needs to separately include functional elements such as a voice element so as to provide the functions of a speaker, a microphone, and the like, as well as a display. In order to achieve this while limiting an increase in outer dimensions, a method can be used in which the display device includes therein these elements. Further, a method is proposed in which the functional elements are laminated on the display element so that the display device has multiple functions. However, also in this case, the functional elements need to be laminated on the display element in a special manner. Otherwise, a thin-shaped display device cannot be achieved even if a size of a frame section is within the limits, as there will be an unnecessary increase in a size of a circuit necessary for normal and external processes. As a result, even if a small-size and lightweight laminated part is achieved, a thin-shaped display device cannot be achieved in view of a signal line connection for inputting and outputting signals.

Particularly, the card-like display device, which is being commercialized today, is unable to have multiple functions while keeping its card-like size, which is a hindrance to further development. Further, as the display device comes to have multiple functions, an increase in cost cannot be avoided, the reduction of which will be a significant issue in the future.

Further, now that a microprocessor can be incorporated into a constituent substrate of a liquid crystal panel, it is expected that the liquid crystal panel will have more and more multiple functions. However, also in this case, functional elements need to be laminated on and connected to a display element in a special manner. Otherwise, a thin-shaped display device cannot be achieved due to the number of connections, and the cost of the display device becoming high.

The present invention has been completed in view of the foregoing problems and has as an object to provide a multifunctional display device which can be achieved at low cost by efficiently using a limited space around the display element without sacrificing the advantages of a lightweight and thin-shaped flat display device.

DISCLOSURE OF INVENTION

In order to attain the foregoing objects, a first display device of the present invention is a display device, including: a display element having a display function; and a functional element having a function different from that of the display element, wherein: the functional element is laminated on the display element so as to be confined in a planar area of the display element, and the display element includes a thin film substrate provided with a circuit element of a display section, the thin film substrate having provided directly thereon (i) a circuit block of a display system, which circuit block processes an externally inputted video signal so as to drive the display section, and (ii) a circuit block of a separate system, which circuit block processes a signal regarding the functional element, and the circuit block of the separate system receives and sends the signal through a flexible printed circuit board which is connected to the thin film substrate and which enables connection to an external device.

According to the foregoing arrangement, the circuit block of the separate system, which circuit block processes the signal regarding the functional element laminated on the display element so as to be confined in the planar area of the display element, and the circuit block of the display system are formed directly on the thin film substrate of the display element. That is, the display element is provided with the circuit block of the separate system, which circuit block is conventionally provided on a separate substrate for the functional element. Therefore, even when the display device is provided with a separate functional element as well as the display element so as to form a multifunctional display device, a thin and small (or slim) functional element can be achieved at low cost.

Furthermore, a signal inputted into or outputted from the circuit block of the separate system is once drawn out onto the flexible printed circuit board (hereinafter referred to as "FPC") which is connected to the thin film substrate, and which enables connection to the external device, such that the signal is relayed through the FPC. Therefore, as compared with an arrangement in which a plurality of FPCs corresponding to a plurality of functions are connected to a thin film substrate, the number of components and the number of connecting steps can be reduced. This also makes it possible to reduce the cost.

On this account, a multifunctional display device can be achieved at low cost while achieving a lightweight and thin-shaped display element without enlarging a frame section.

Further, the first display device of the present invention is arranged such that the circuit block of the separate system on the display element and the functional element to be laminated on the display element are connected through (i) a first printed circuit board, which is the printed circuit board for connecting the display element to the external device, and (ii) a second flexible printed circuit board, one end of which is connected to the functional element and the other end of which is connected to a middle portion of the first printed circuit board.

According to the foregoing arrangement, the signal processed at the circuit block of the separate system on the thin film substrate is conducted through the first FPC connected to the thin film substrate. The middle portion of the first FPC is provided with a connecting terminal part of a line of the signal. One end of the second FPC is connected to the functional element, and the other end of the second FPC is adhered to the connecting terminal part. In this way, a V-shaped signal line connection is made.

Thus, even when an arrangement is such that the signal processed at the thin film substrate is conducted to the functional element laminated above the thin film substrate, the FPCs can be mounted so as to be confined within a predetermined width without causing the frame section to be enlarged due to an increase in the number of connection points, the increase being caused by FPCs connected out of alignment with one another. Further, the signal can be conducted through a simple and inexpensive connection where the FPCs are superposed on each other so as to be joined to each other with adhesive, with high connection reliability being ensured. Furthermore, in the foregoing method, unlike a method in which an FPC is curved to make a U-shaped signal line connection, a curved portion does not increase in thickness, and a connection part is not put under resilient restoration stress from the FPC.

On this account, a multifunctional display device can be more effectively achieved at low cost while achieving a lightweight and thin-shaped display element without enlarging a frame section.

Further, the first display device of the present invention is arranged such that the printed circuit board for connecting the display element to the external device inputs the video signal into the display element.

Since the first display device is a display device, an FPC for receiving a video signal from an external device is necessarily connected to the thin film substrate. Therefore, it is preferable that the first FPC be a video-signal-inputting FPC.

Further, the first display device of the present invention is arranged such that a plurality or plural types of the foregoing functional element are provided and arranged such that the thin film substrate is provided with a plurality or plural types of circuit blocks of separate systems corresponding to the plurality or plural types of the foregoing functional element.

According to the foregoing arrangement, since the first display device includes the plurality or plural types of functional elements, a more multifunctional display device can be achieved. In this case, the plurality or plural types of functional elements are laminated on the side of a display surface of the display element or the side of a back surface of the display element, and the circuit blocks of the functional elements are formed on the thin film substrate of the display element. However, the signal is inputted into or outputted from the circuit blocks by using the FPC connected to the thin film substrate. More preferably, the circuit blocks of the separate systems and the functional elements are connected by also using the FPC connected to the thin film substrate. This brings about an effect of connecting a plurality of functional elements to a display device at low cost while achieving a lightweight and thin-shaped display element without enlarging a frame section.

In order to attain the foregoing objects, a second display device of the present invention is a display device, including: a display element having a display function; and a functional element having a function different from that of the display element, wherein: the functional element is laminated on the display element so as to be confined in a planar area of the display element, and the display element includes a thin film substrate provided with a circuit element of a display section, the thin film substrate having provided directly thereon an arithmetic processing device, and the functional element and the thin film substrate are connected by using (i) a first flexible printed circuit board, enabling external connection, one end of which is connected to the display element, and (ii) a second flexible printed circuit board, one end of which is connected to the functional element and the other end of which is connected to a middle portion of the first printed circuit board.

According to the foregoing arrangement, the arithmetic processing device is formed directly on the thin film substrate of the display element, and the signal regarding the functional element can be subjected to intellectual processing at the arithmetic processing device, the functional element being laminated on the display element so as to be confined in the planar area. Therefore, when a multifunctional display device is achieved which includes a separate functional element as well as the display element, (i) a function of the circuit block of the separate system, which circuit block is conventionally provided on a separate substrate for the functional element, or (ii) a function of a logic circuit block, which includes programming steps such as condition branches, is achieved by using the arithmetic processing device on the side of the display element. In this way, a thin and small (or slim) functional element can be achieved at low cost.

Furthermore, the signal processed at the arithmetic processing device of the thin film substrate is conducted through the first FPC connected to the thin film substrate. The middle portion of the first FPC is provided with a connecting terminal part. One end of the second FPC is connected to the functional element, and the other end of the second FPC is pasted to the connecting terminal part. In this way, a signal branch is made.

Thus, as with the first display device, even when an arrangement is such that the signal processed at the thin film substrate is conducted to the functional element laminated above the thin film substrate, the signal can be conducted through a simple and inexpensive connection, with high connection reliability being ensured.

On this account, the arithmetic processing device is incorporated into the display element, and the functional element is driven by taking advantage of the processing capacity of the arithmetic processing device. The functional element is laminated above the thin film substrate so as to achieve a multifunctional display device. This brings about an effect of achieving a multifunctional display device at low cost while achieving a lightweight and thin-shaped display element.

The second display device of the present invention is arranged such that a plurality or plural types of the foregoing functional element are provided.

According to the foregoing arrangement, since the plurality or plural types of functional elements are provided, a more multifunctional display device can be achieved. Moreover, in this case, the plurality of functional elements are laminated. However, the arithmetic processing device and each of the functional elements are connected by using the FPC connected to the thin film substrate, the arithmetic processing device processing a signal of the functional element. This brings about an effect of connecting the plurality of functional elements at low cost while achieving the lightweight and thin-shaped display element. The same effects as that of the first display device can be expected in terms of superposition, press bonding, and elimination of bending stress, and the like.

The first and second display devices of the present invention are arranged such that the functional element is a sound source element, a sound collection element, a touch panel, a separate display element, or the like, the sound source element generating a sound corresponding to an audio signal, the sound collection element collecting a voice so as to convert the voice into the audio signal, the touch panel being disposed on the side of a display surface of the display element and outputting a signal corresponding to an input position of an operator. (Alternatively, when the plurality or plural types of functional elements are provided, at least one of the functional elements is the sound source element, the sound collection element, the touch panel, the separate display element, or the like.) Further, the first display device of the present invention is arranged such that an image-processing substrate is disposed on the side of a back surface of the display element and subjects the video signal to image processing based on an externally inputted control signal. (Alternatively, when the plurality or plural types of functional elements are provided, at least one of the functional elements is the image-processing substrate.)

When the functional element is the voice element or the sound collection element, the operator can enjoy voice as well as display. When the functional element is the touch panel, the operator can input information and an instruction directly to a display screen. Further, in an arrangement in which a plurality of display elements are laminated, a background display and an object display can be separated, thereby lessening a burden on the side of the external device. It is possible to generate a video signal for the background or object display independently of a video signal of the external device and superimpose the video signals. Further, when the functional element is the image-processing substrate, it becomes possible to perform image processing in the display device.

Further, the first and second display devices of the present invention are arranged such that the thin film substrate has a thin film layer including a polycrystalline silicon thin film or a continuous grain boundary silicon thin film.

Further, the first and second display devices of the present invention are arranged such that the display element performs display by using a liquid crystal or an EL layer.

For a fuller understanding of the nature and advantages of the invention, reference should be made to the ensuing detailed description taken in conjunction with the accompanying drawings.

BEST MODE FOR CARRYING OUT THE INVENTION

The present invention will be explained in more detail below by way of examples and comparative examples. However, it should be understood that the present invention is not limited to such examples.

Embodiments of the present invention will be described below with reference to FIGS. 1 to 21.

Figure 1:
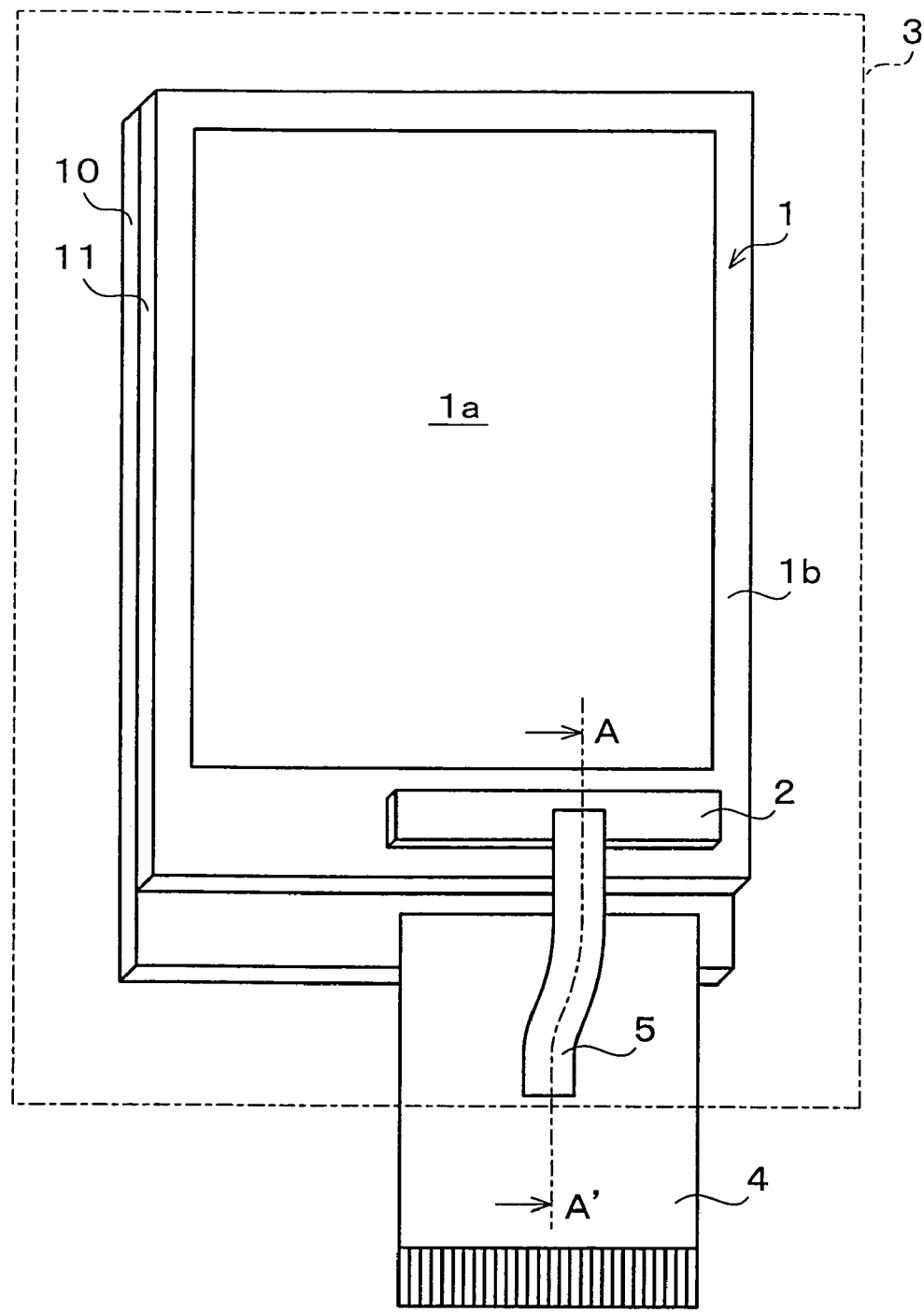
FIG. 1 is a perspective view illustrating an arrangement of a sound-generating display device according to a first embodiment of the present invention.
Figure 2:
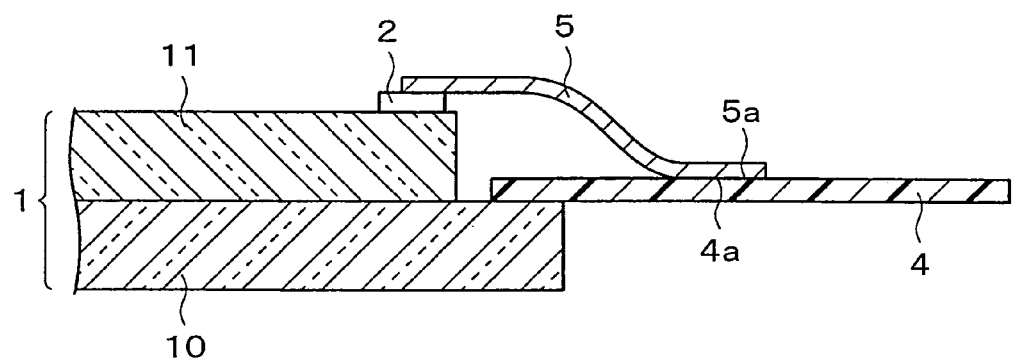
FIG. 2 is a cross-sectional view of the sound-generating display device of FIG. 1 taken along a line A-A'.
Figure 3:
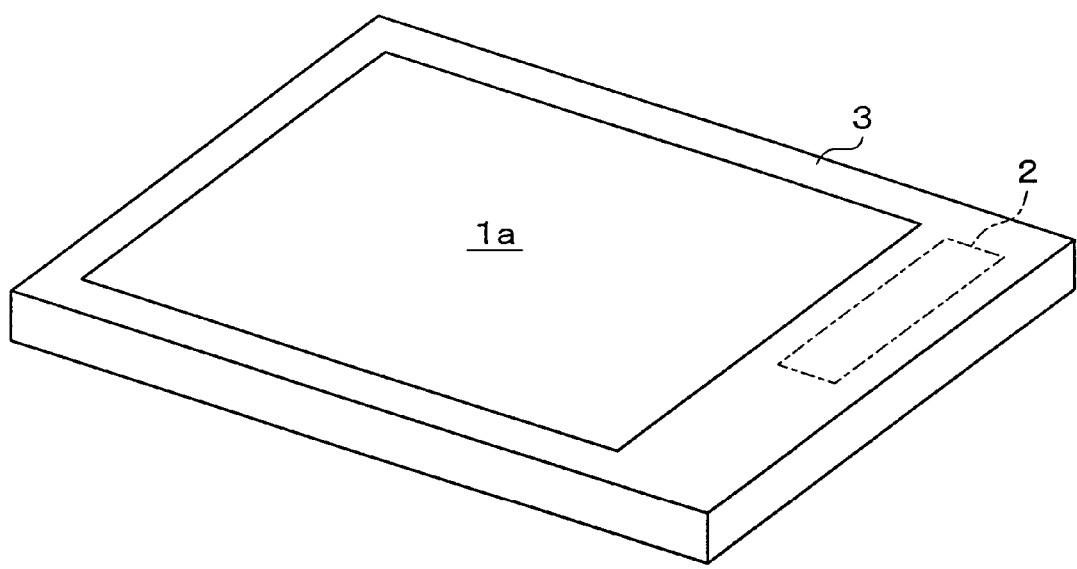
FIG. 3 is an outline view of the sound-generating display device.
Figure 4:
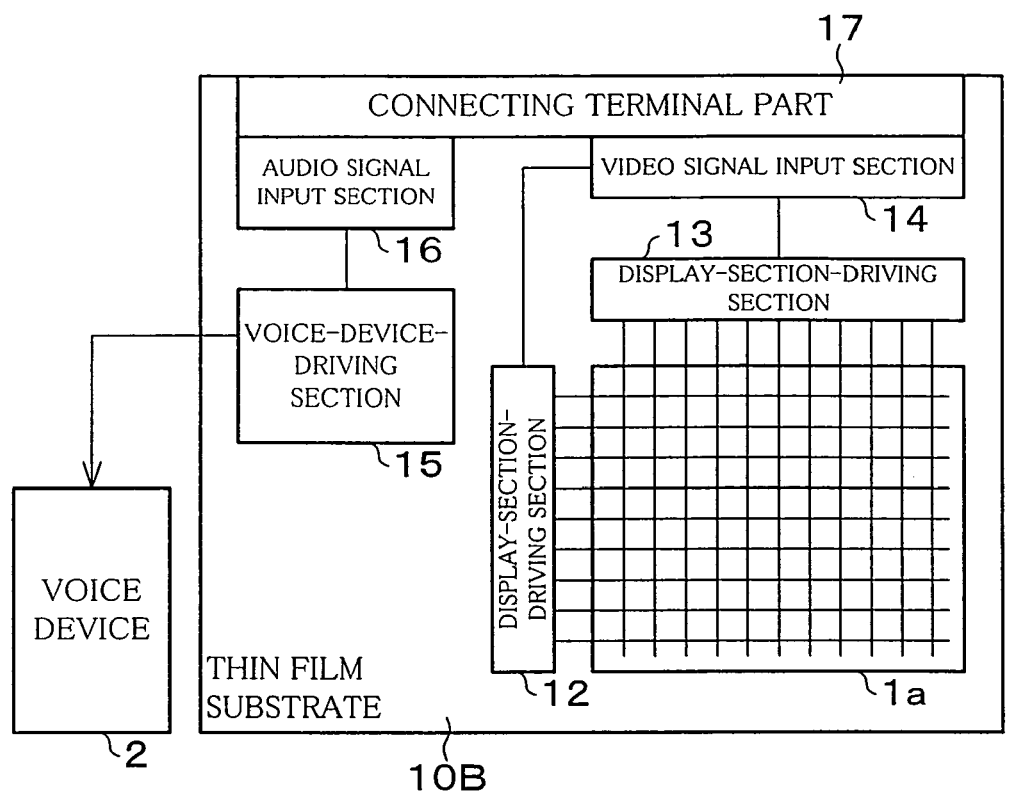
FIG. 4 is a functional image diagram of a thin film substrate of a liquid crystal panel mounted in the sound-generating display device.

FIG. 1 is a perspective view illustrating an arrangement of a sound-generating display device according to a first embodiment of the present invention. FIG. 2 is a cross-sectional view taken along a line A-A' in FIG. 1. FIG. 3 is an outline view of the sound-generating display device. FIG. 4 is a functional image diagram of a thin film substrate of a liquid crystal panel mounted in the sound-generating display device.

In the present embodiment, a liquid crystal panel using liquid crystal is exemplified as a display element having a display function. However, in each of the embodiments described later, the display element is not to be limited to the liquid crystal panel. Further, a voice device serving as a sound source element for generating a sound corresponding to an audio signal is exemplified as a functional element. However, the functional element may be a sound collection element (microphone) which collects a sound so as to convert the sound into an audio signal, or may have functions of both a sound source element and a sound collection element.

As illustrated in FIG. 1, the sound-generating display device includes a liquid crystal panel 1 and a voice device 2 serving as a functional element. The liquid crystal panel 1 has a pair of transparent substrates 10 and 11, such as glass substrates, with liquid crystals interposed therebetween. The substrate 10 has provided thereon a thin film layer containing a polycrystalline silicon (polysilicon) thin film, and the thin film layer is positioned on a side opposite to the substrate 11. The thin film layer is used to form a pixel-driving TFT (thin film transistor) and the like. The substrate 10 is hereinafter referred to as "thin film substrate 10." Note that the thin film substrate 10 may have provided thereon a thin film layer containing CG silicon. Meanwhile, the substrate 11 has provided thereon a common electrode including a transparent conductive layer such as ITO, and the common electrode is positioned on a side opposite to the substrate 10. The substrate 11 is referred to as "counter substrate 11."

As illustrated also in FIG. 3, the liquid crystal panel 1 and the voice device 2 are confined in a bezel 3 serving as a housing of the sound-generating display device. The bezel 3 covers a back surface of the liquid crystal panel 1 and is provided with an opening at a position corresponding to a display section 1a which contributes to display.

The voice device 2 is disposed on a display surface so as to be positioned at an edge section 1b around the display section 1a of the liquid crystal panel 1. The edge section 1b corresponds to the frame section of the sound-generating display device. The voice device 2 may be fixed to the liquid crystal panel 1 or to the bezel 3, as long as it is positioned as described above.

Note that, as described later, the voice device 2 may be disposed on the back surface of the liquid crystal panel 1, which back surface serves as a back surface of the sound-generating display device. In this case, the voice device 2 does not need to be positioned at the edge section 1b when, for example, the liquid crystal panel 1 is a reflective type. Instead, the voice device 2 only needs to be laminated on the liquid crystal panel 1 so as to be confined in a planar area of the liquid crystal panel 1. The sound-generating display device generally includes another optical device such as an optical waveguide, but the description thereof will be omitted here for simplicity of description.

Incidentally, in order to dispose the voice device 2 at the edge section 1b without enlarging the edge section 1b, the voice device 2 needs to be thin, small, and slim. When the liquid crystal panel 1 is a reflective type and the voice device 2 is positioned on the back surface of the liquid crystal panel 1, the voice device 2 does not need to be as thin, small, and slim as when positioned in the edge section 1b on the display surface. However, in order to ensure space for other functional elements to be disposed, the voice device 2 should be kept thin, small and slim.

A piezoelectric element or a normal voice coil speaker is used as the voice device 2. In the case of using a piezoelectric element, the piezoelectric element includes a thin plate made of Rochelle-salt crystal or ceramic. In either case, the voice device 2 conventionally needs to separately include a circuit block of a voice system (circuit block of a separate system), which circuit block includes a semiconductor element and the like. The circuit block including the semiconductor element cannot be incorporated into the voice device, whence a separate substrate is needed.

However, if the voice device 2 goes so far as to include such a circuit block of a voice system so as to form a device, the device may become too large to be confined in the frame section (corresponding to the edge section 1b of the liquid crystal panel 1) of the sound-generating display device. As with the present embodiment, the voice device 2 can be disposed at the widest side of the edge section 1b in case of a comparatively large-size liquid crystal display of 7 to 10 inches. However, a size of a liquid crystal display suitable for use as a normal portable liquid crystal display is much smaller. In a case of a liquid crystal display having a diagonal length of approximately 4 inches or less, space for a substrate is expected to be insufficient along a diaphragm's major axis in view of a wavelength of a voice to be oscillated by the voice device. (A major axis of a diaphragm depends on the density of a material of the diaphragm but is normally from approximately 20 nm to 40 nm.) Further, it is expected that a more multifunctional display device will be achieved in the future, where another functional element that cannot be easily slimmed will be disposed at the widest side, and the voice device will be disposed in a narrower side. In that event, it will be necessary that the voice device be made slim, wherefore it will be impossible that the voice device goes so far as to include a circuit block of a voice system so as to form a device. Further, when the voice device includes a separate substrate, an increase in the cost of the voice device cannot be avoided.

Accordingly, in the present embodiment, as illustrated in FIG. 4, such a circuit block of a voice system is formed on the thin film substrate 10 of the liquid crystal panel 1. The circuit block of the voice system includes a voice-device-driving section 15 and an audio signal input section 16. The thin film substrate 10 is provided with a circuit element and a circuit block of a display system in a place corresponding to the display section 1a. The circuit element includes the pixel-driving TFT and a pixel electrode. The circuit block of the display system includes display-section-driving sections 12 and 13 and a video signal input section 14. Furthermore, the circuit block of the voice system is formed on the same thin film layer as the circuit block of the display system.

The video signal input section 14 receives a video signal from various external devices and inputs the video signal into the display-section-driving sections 12 and 13. The display-section-driving sections 12 and 13 process the video signal so as to drive the display section 1*a*. The audio signal input section 16 receives an audio signal from various external devices and inputs the audio signal into the voice-device-driving section 15. The voice-device-driving section 15 processes the audio signal so as to drive the voice device 2.

Thus, the circuit block of the voice system is formed on the thin film substrate 10 of the liquid crystal panel 1, so that the voice device 2 can be thin, small, and slim. This makes it possible to dispose the voice device 2 in the frame section (edge section 1*b* of the liquid crystal panel 1) of the sound-generating display device without problems, and the cost can be reduced since a separate substrate is not needed.

Further, in the present embodiment, an audio signal and a video signal are inputted by using a flexible printed circuit (hereinafter referred to as "FPC") 4 connected to a connecting terminal part 17 (see FIG. 4) of the thin film substrate 10. Therefore, in this arrangement, as compared with an arrangement in which the thin film substrate 10 is provided with two FPCs (a video-signal-inputting FPC and an audio-signal-inputting FPC), the number of components and the number of connecting steps can be reduced, thereby making it possible to reduce the cost.

Moreover, what should be further noted in the present embodiment is a connection method in which the voice device 2 laminated on the liquid crystal panel 1 is connected to the voice-device-driving section 15 formed on the thin film substrate 10 of the liquid crystal panel 1.

Figure 5:
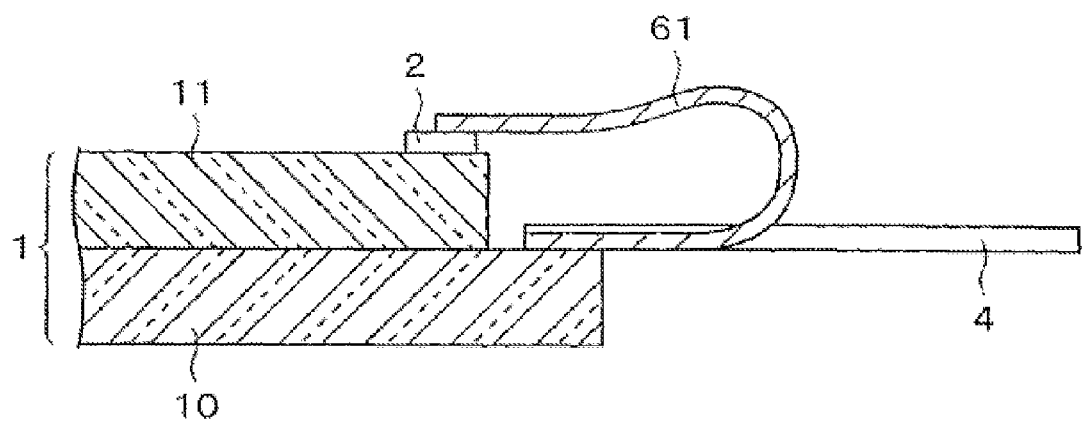
FIG. 5 is a cross-sectional view of a main portion of the thin film substrate of the liquid crystal panel and a voice device connected to each other by a conventional method.

FIG. 5 illustrates a way in which the voice-device-driving section 15 formed on the side of the thin film substrate 10 and the voice device 2 laminated above the thin film substrate 10 are connected to each other by a conventional connection method. That is, the voice-device-driving section 15 and the voice device 2 are connected using a single U-shaped FPC 61. However, when the single FPC 61 is curved as described above, a connection part of the FPC 61 is subjected to load due to rigidity of the FPC 61, and this undermines reliability of the connection. Further, the FPC 61 cannot be severely curved, because the FPC 61 can afford only a small curvature. Therefore, under such conditions that the FPC 61 is curved, a large portion of the FPC 61 protrudes outside the liquid crystal panel 1, contradicting efforts to narrow the frame section. Further, in such a process for manufacturing the sound-generating display device under such conditions where the FPC 61 is put under stress, there may be an increase in cost of manufacturing and a decrease in yield. Even when the sound-generating display device is shipped in good condition, resilient restoration stress due to the curvature of the FPC 61 may constantly subject peeling stress on the connection part in which the FPC 61 is connected to the thin film substrate.

Accordingly, in the present embodiment, as illustrated more particularly in FIG. 2, the FPC 4, which is connected to the thin film substrate 10 and inputs a video signal and an audio signal, is used for connection. The FPC 4 is provided with (i) a wire (not shown) for conducting a signal outputted from the voice-device-driving section 15 and (ii) a connecting terminal part 4*a* connected to the wire. It is preferable that the connecting terminal part 4*a* be positioned in a middle portion of the FPC 4 and confined in the bezel 3. Moreover, the voice device 2 is connected to one end of another FPC 5, and the other end of the FPC 5 is provided with a connecting terminal part 5*a*. The connecting terminal part 5*a* is connected (electrically and mechanically) to the connection terminal 4*a* in such a way that one facing surface is pasted to the other facing surface. The connection is performed by using a technique such as an ACF press bonding technique or a soldering technique.

That is, the FPC 4 and the FPC 5 are provided. The FPC 4 connects the liquid crystal panel 1 to an external device, and the FPC 5 connects a signal line to the voice device 2 laminated on the liquid crystal panel 1. The one end of the FPC 5 is connected to the voice device 2, and the other end of the FPC 5 is connected to the middle portion of the FPC 4. In this way, the circuit block of the voice system on the liquid crystal panel 1 and the voice device 2 are connected through both the FPCs 4 and 5.

In such connection using FPC 4, the FPC 5 is not U-shaped, so that the FPC 5, the voice device 2, and the FPC 4 are connected with high reliability. Further, the FPC 5 can be sufficiently short, so that a portion that protrudes outside the liquid crystal panel 1 can be small. This achieves a result that complements efforts to narrow the frame section. Moreover, the joining (bonding) is performed by simply adhering the FPC 4 to the FPC 5, such that the connection is easier than that of FIG. 5 and can be performed at low cost.

Japanese Laid-Open Application 29288/2003 (Tokukai 2003-29288; published on Jan. 29, 2003) describes an arrangement in which a liquid crystal panel FPC is preliminarily provided with a heater FPC for warming up a liquid crystal panel. A side view of the arrangement looks similar to FIG. 2 of the present invention. However, the arrangement is such that totally parallel signals are supplied to two different devices by using an FPC whose middle portion is branched. Meanwhile, as with the present embodiment, the connection method according to the present invention draws a V-shaped signal supply line by using the FPCs 4 and 5 so that a signal outputted from the thin film substrate 10 is supplied to the voice device 2 laminated above the thin film substrate 10. Thus, the arrangement and the connection method are totally different in terms of signal line topology.

As described above, the sound-generating display device according to the present embodiment includes the voice device 2 in addition to the liquid crystal panel 1. The voice device 2 is laminated on the liquid crystal panel 1 so as to be confined in a planar area of the liquid crystal panel 1. The thin film substrate 10, which is one of the two substrates of the liquid crystal panel 1, is provided with the circuit block of the voice system (the audio signal input section 16 and the voice-device-driving section 15) for driving the voice device 2 which includes a semiconductor circuit and the like. A signal is inputted into the circuit block of the voice system through the FPC 4 which is connected to the thin film substrate 10 and which inputs a video signal into the circuit block of the display system.

Thus, even when the display device includes the voice device 2 in addition to the liquid crystal panel 1 so as to form a multifunctional display device, the thin film substrate 10 of the liquid crystal panel 1 is used to process an audio signal. In this way, the voice device 2 can be made thinner, smaller, and slimmer, and at lower cost than when a separate substrate is used, and the voice device 2 can be laminated on the liquid crystal panel 1 so as to be confined within a size of the frame section without problems. Furthermore, because the FPC 4 for inputting a video signal also inputs an audio signal, the number of components and the number of connecting steps can be reduced as compared with an arrangement in which a video-signal-inputting FPC is connected to the thin film substrate 10 and an audio-signal-inputting FPC is connected to a separate circuit substrate of a voice system. This also makes it possible to reduce the cost.

Furthermore, the sound-generating display device according to the present embodiment conducts a signal by using the FPC 4 connected to the thin film substrate 10, the signal being processed at the circuit block of the voice system on the thin film substrate 10. The middle portion of the FPC 4 is provided with the connecting terminal part 4a. One end of the FPC 5 is connected to the voice device 2, and the other end of the FPC 5 is connected to the connecting terminal part 4a. In this way, a signal circuit is made so as to send the signal to the voice device 2.

Thus, even when an arrangement is such that the signal processed at the thin film substrate 10 is outputted to the voice device laminated above the thin film substrate 10, high connection reliability can be ensured at low cost without enlarging the frame section.

Furthermore, according to such a connection method, even when a different functional element, as well as the voice device 2, is laminated on a display surface or a back surface of the liquid crystal panel 1, and the different functional element is connected to a circuit block of the different functional element which circuit block is formed on the thin film substrate 10 of the liquid crystal panel 1, the essential FPC 4 can be used whose middle portion is provided with a connecting terminal part, so that the different functional element can be easily connected while keeping the size of the frame section the size of the voice device 2. Therefore, such a connection method is particularly advantageous in such an arrangement that where a functional element is laminated on the display element (herein referred to as "liquid crystal panel 1") so as to achieve a multifunctional display device.

Figure 6A:
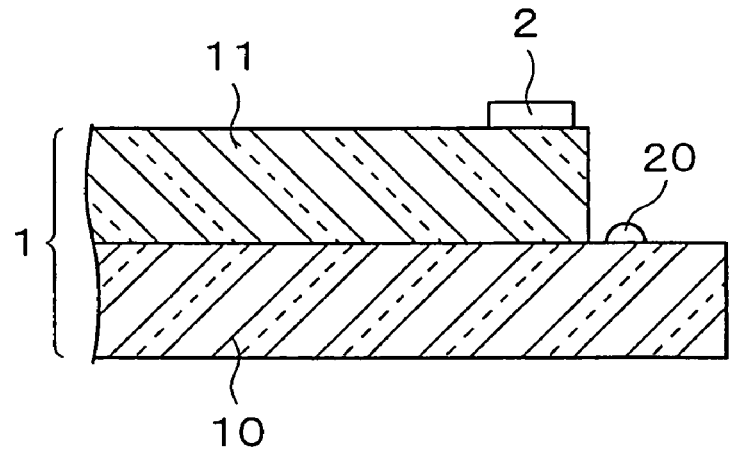
FIGS. 6(a) to 6(c) are schematic diagrams illustrating positions in which the voice device is laminated on the liquid crystal panel.
Figure 6B:
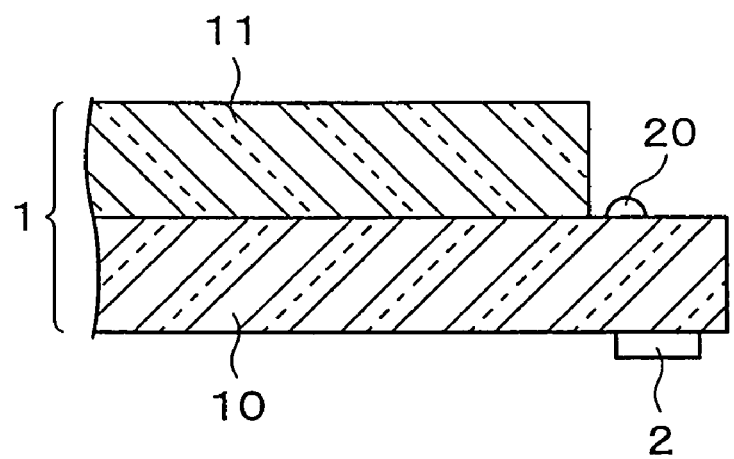
Figure 6C:
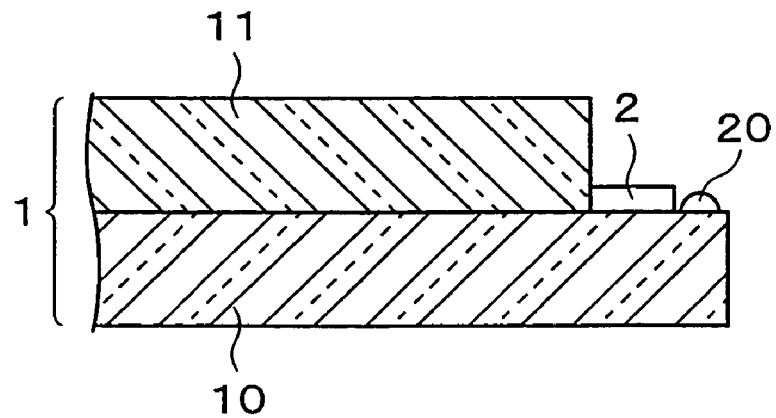

In the foregoing description, the voice device 2 is disposed at the edge section 1b on the side of the display surface of the liquid crystal panel 1. However, as described above, the voice device 2 can be disposed at the side of the back surface of the liquid crystal panel 1. FIGS. 6(a) to 6(c) illustrate positions in which the voice device 2 is disposed.

FIG. 6(a) illustrates a state in which the voice device 2 is disposed on the counter substrate 11 disposed on an upper surface or the display surface of the liquid crystal panel 1. FIG. 6(b) illustrates a state in which the voice device 2 is disposed on a lower surface or the back surface of the liquid crystal panel 1. As described above, when the voice device 2 is disposed in these positions, the voice device 2 may be fixed to the liquid crystal panel 1 or a bezel (not shown).

Further, FIG. 6(c) illustrates a state in which the voice device 2 is disposed in a part provided with a terminal 20 of a circuit formed on the thin film layer of the thin film substrate 10 (that part of the thin film substrate which extends longer than the counter substrate 11). According to this arrangement, the thickness of the voice device 2 is not added to the thickness of the liquid crystal panel 1, thereby causing the sound-generating display device to be thinner accordingly.

Figure 7:
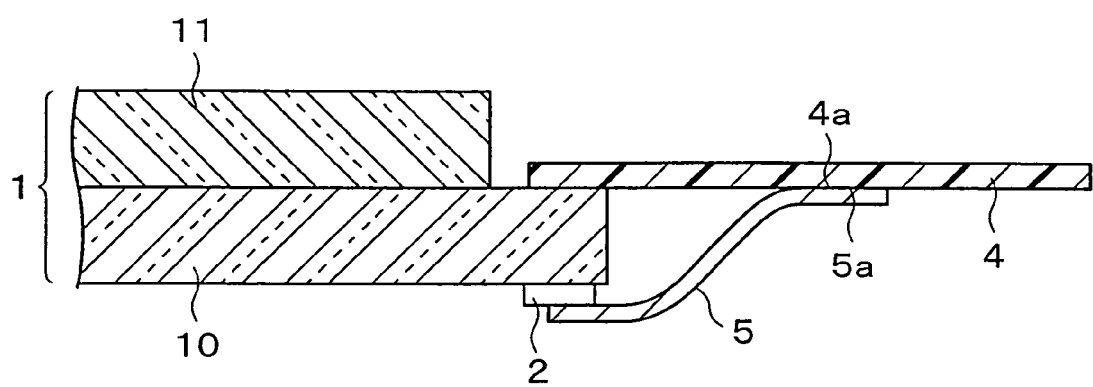
FIG. 7 is a cross-sectional view of a main portion of the voice device disposed on a back surface of the liquid crystal panel.

FIG. 7 is a cross-sectional view of a main portion of the sound-generating display device including the voice device 2 disposed on the back surface of the liquid crystal panel 1. This corresponds to FIG. 2 of the sound-generating display device of the arrangement of FIG. 1.

Other embodiments of the present invention will be described below.

Figure 8:
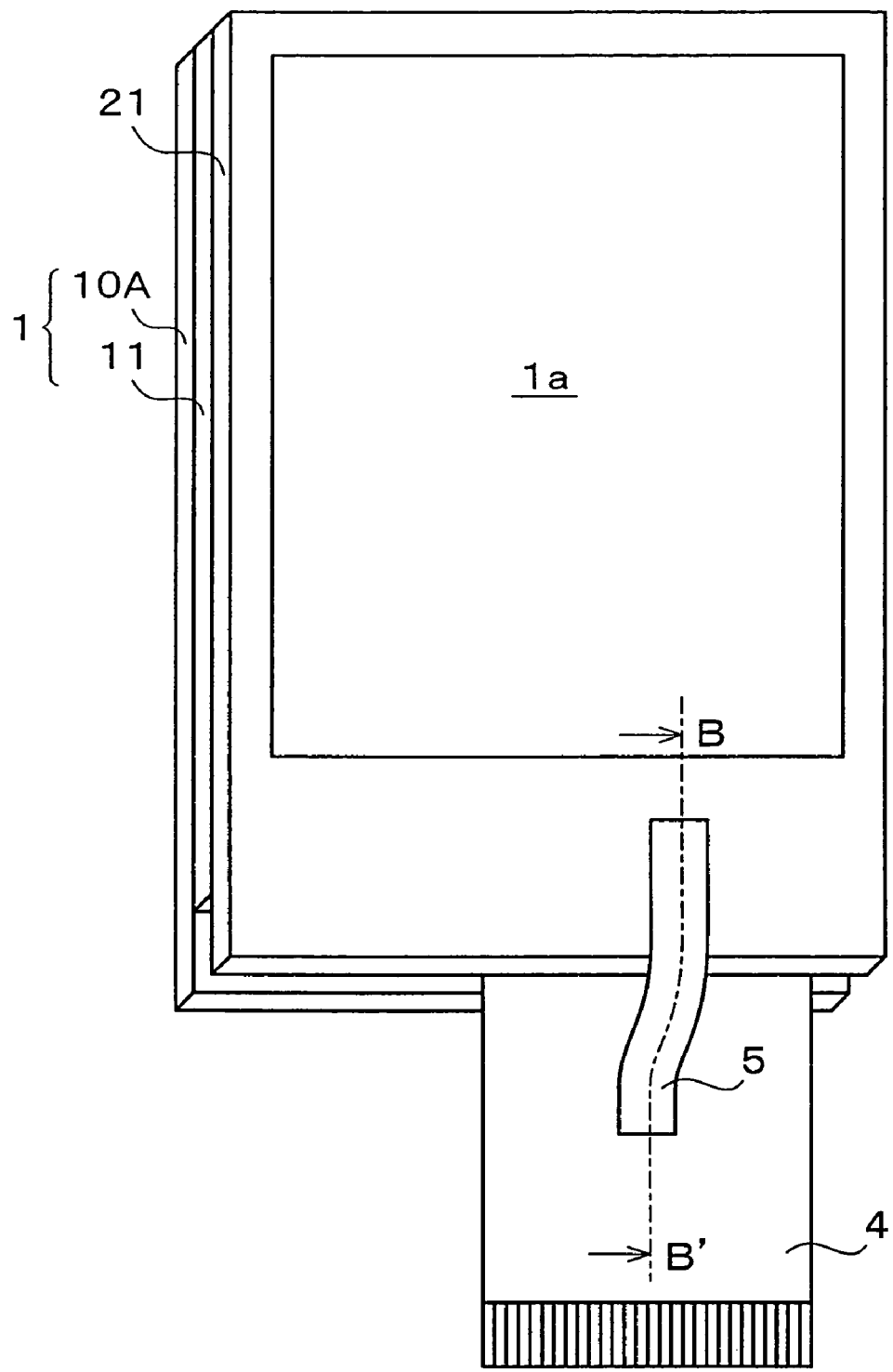
FIG. 8 is a perspective view illustrating an arrangement of a touch-panel-equipped display device according to a second embodiment of the present invention.
Figure 9:
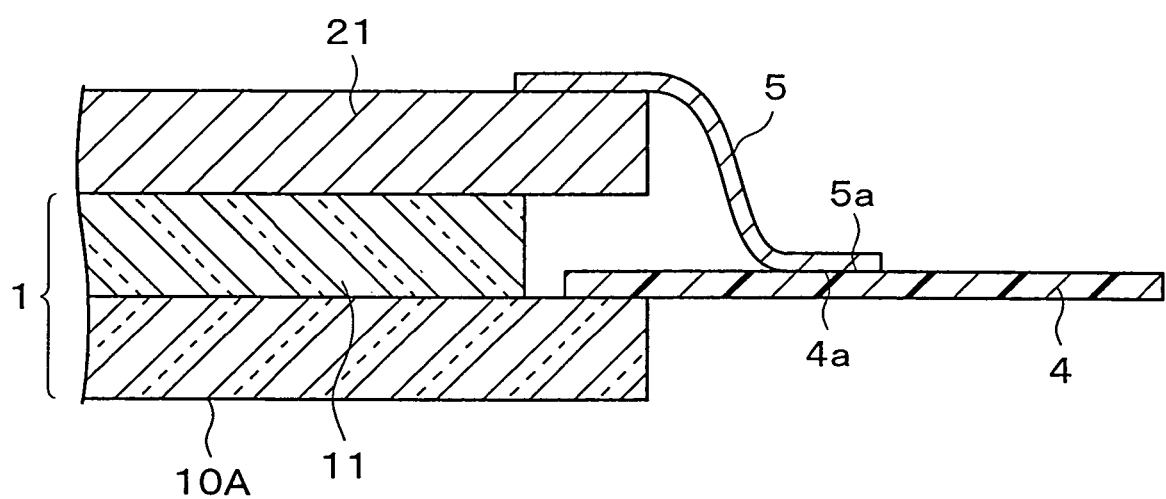
FIG. 9 is a cross-sectional view of the touch-panel-equipped display device of FIG. 8 taken along a line B-B'.
Figure 10:
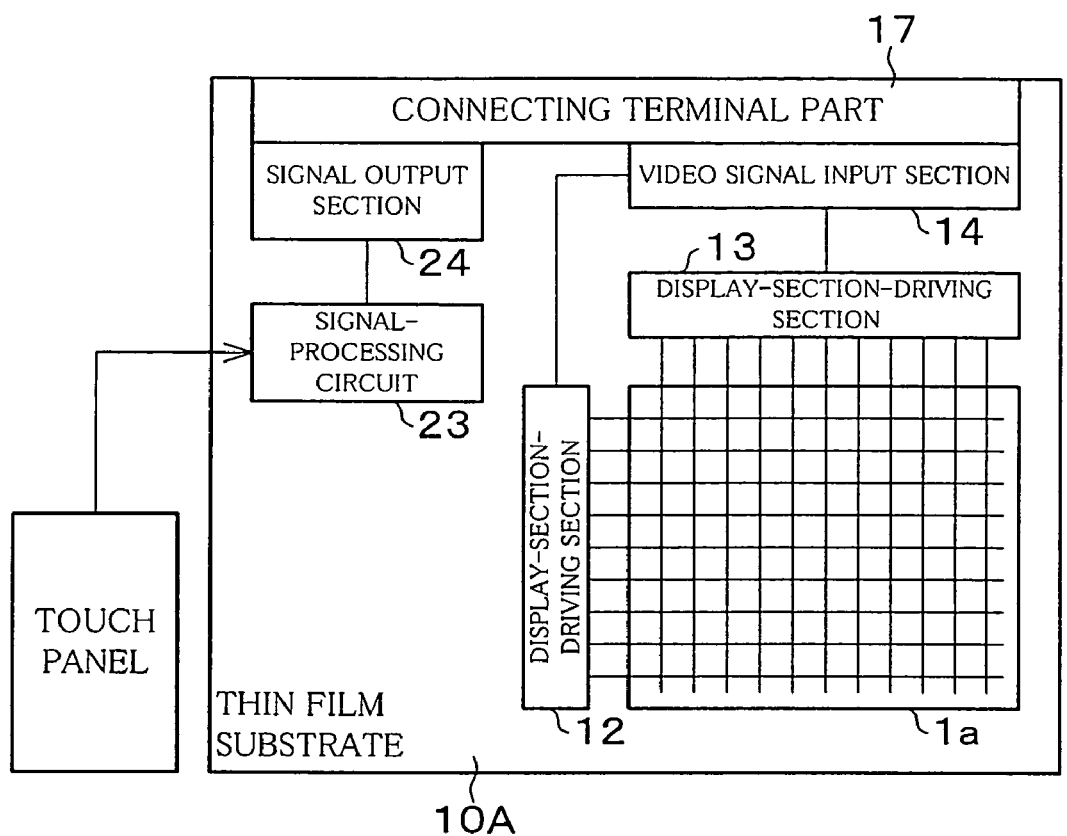
FIG. 10 is a functional image diagram of a thin film substrate of a liquid crystal panel mounted in the touch-panel-equipped display device.

FIG. 8 is a perspective view of an arrangement of a touch-panel-equipped display device according to a second embodiment of the present invention. FIG. 9 is a cross-sectional view of the touch-panel-equipped display device of FIG. 8 taken along the line B-B'. FIG. 10 is a functional image diagram of a thin film substrate 10A of a liquid crystal panel 1. Note that, for the sake of convenience, components having the same functions as those described in the first embodiment are given the same reference numerals, and explanations thereof are omitted here.

As illustrated in FIG. 8, the touch-panel-equipped display device according to the present embodiment includes as a functional element a touch panel 21. The touch panel 21 generates a potential change or a current change in accordance with a position indicated by an operator so as to output the change as a signal. The touch panel 21 is laminated on a surface of the liquid crystal panel 1 so as to be confined in a planar area of the liquid crystal panel 1.

As illustrated in FIG. 10, the thin film substrate 10A of the liquid crystal panel 1 includes a circuit block of a display system and a circuit block of a touch panel system. The circuit block of the touch panel system is a circuit block of a separate system which circuit block includes a signal-processing circuit 23, which converts into position information the signal outputted from the touch panel 21, and a signal output section 24. The circuit block of the touch panel system, as well as the circuit block of the display system, is formed by using a thin film layer.

The circuit block of the touch panel system is formed on the thin film substrate 10A, so that the touch panel 21 can be simplified so as to be thinner, lighter, and more inexpensive as compared with an arrangement in which the touch panel 21 includes the circuit block of the touch panel system. Therefore, even when arranged so as to include the touch panel 21, the touch-panel-equipped display device can be arranged at low cost without enlarging and thickening a frame section and the display device as a whole.

Further, also in this case, the position information signal is conducted from the thin film substrate 10A by using an FPC 4 for inputting a video signal. Therefore, the number of components and the number of connecting steps can be reduces as compared with such an arrangement in which an FPC for conducting the position information signal is connected to the thin film substrate 10A separately from the FPC 4 for inputting the video signal. This also makes it possible to reduce the cost.

As illustrated more particularly in FIG. 9, the touch panel 21 laminated on the liquid crystal panel 1 and the signal-processing circuit 23 formed on the thin film substrate 10A of the liquid crystal panel 1 are connected by using the FPC 4 which is connected to the thin film substrate 10A and which inputs the video signal. That is, the FPC 4 is provided with (i) a wire (not shown) for inputting the signal into the signal-processing circuit 23 and (ii) a connecting terminal part 4a connected to the wire. The connecting terminal part 4a is positioned in a middle portion of the FPC 4 and preferably in a bezel 3. Moreover, one end of another FPC 5 is connected to the touch panel 21, and the other end of the FPC 5 is provided with a connecting terminal part 5a. The connecting terminal part 5a is connected (electrically and mechanically) to the connection terminal 4a in such a way that one facing surface is adhered to the other facing surface. Also in this case, the connection is performed by using a technique such as an ACF press bonding technique or a soldering technique.

According to the present embodiment, since the functional element is the touch panel 21, the signal flows from the touch panel 21 to the circuit block of the touch panel system which circuit block is formed on the thin film substrate 10A of the liquid crystal panel 1. That is, as compared with the foregoing sound-generating display device according to the first embodiment, the signal flows in an opposite direction. However, by adopting the foregoing arrangement so as to provide the touch-panel-equipped display device with the touch panel 21, a multifunctional display device can be achieved by effectively using a limited space around the display element. In this light, the present embodiment brings about the same effect as the first embodiment.

Figure 11:
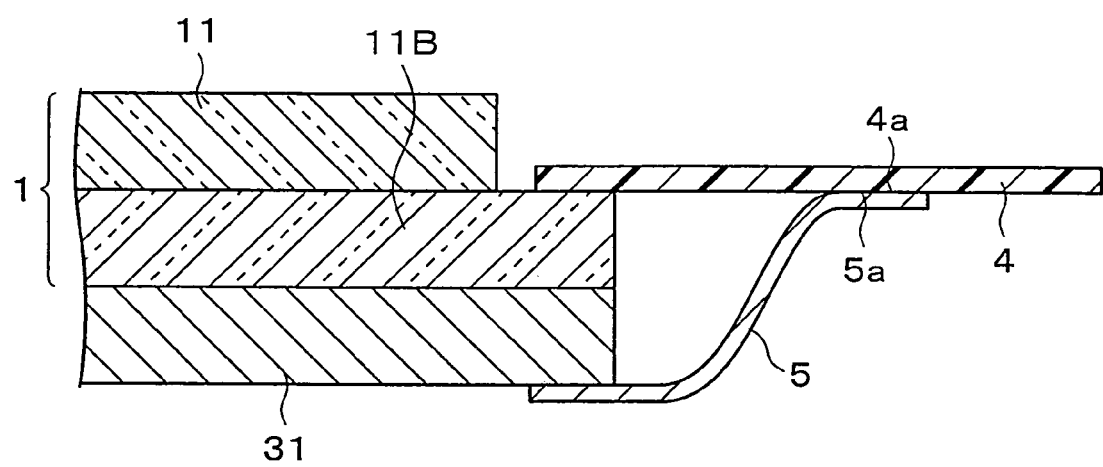
FIG. 11 is a cross-sectional view of a main portion of an image-processing display device according to a third embodiment of the present invention.
Figure 12:
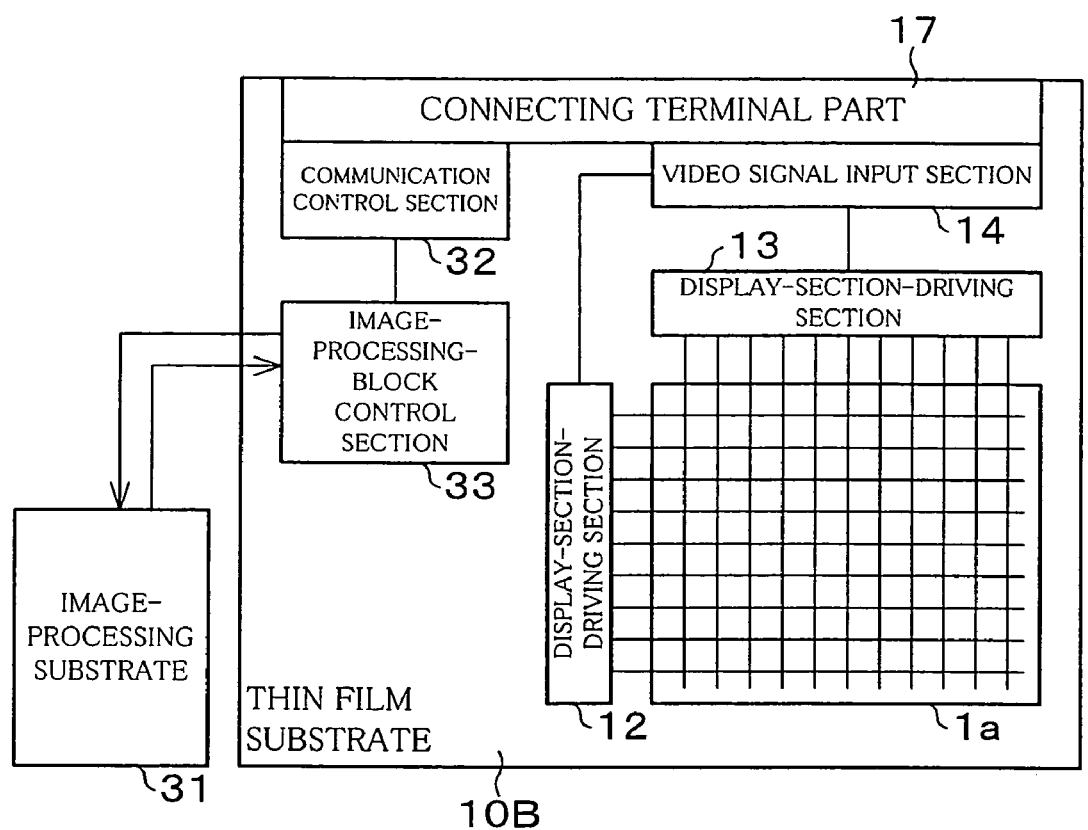
FIG. 12 is a functional image diagram of a thin film substrate of a liquid crystal panel mounted in the image-processing display device.

FIG. 11 is a cross-sectional view of a main portion of an image-processing display device according to a third embodiment of the present invention. This corresponds to the cross-sectional view of FIG. 2 of the foregoing sound-generating display device according to the first embodiment. Further, FIG. 12 is a functional image diagram of a thin film substrate 10B which is located in a liquid crystal panel 1 and includes a circuit block of an image-processing substrate. Note that, for the sake of convenience, components having the same functions as those described in the first embodiment are given the same reference numerals, and explanations thereof are omitted here.

The image-processing display device according to the present embodiment includes as a functional element an image-processing substrate 31. The image-processing substrate 31 is an image processing substrate which subjects a video signal to image processing based on an externally inputted control signal inputted. The image-processing substrate 31 is laminated on a back surface of the liquid crystal panel 1 so as to be confined in a planar area of the liquid crystal panel 1.

As illustrated in FIG. 12, the thin film substrate 10B of the liquid crystal panel 1 includes a circuit block of a display system and a circuit block of an image-processing system. The circuit block of the image-processing system is a circuit block of a separate system which circuit block includes a communication control section 32 and an image-processing-block control section 33. The circuit block of the image-processing system, as well as the circuit block of the display system, is formed by using a thin film layer.

The communication control section 32 selects, from the side of an external host, a process to be executed at the image-processing substrate 31. Further, the communication control section 32 controls data transfer. The image-processing-block control section 33 interprets a code so as to activate and deactivate the image-processing substrate 31, send data when necessary, send a data request to the external host, and perform error management, the code being inputted from the communication control section 32.

Moreover, also in the present embodiment, as illustrated more particularly in FIG. 11, the image-processing substrate 31 laminated on the liquid crystal panel 1 and the image-processing-block control section 33 formed on the thin film substrate 10B of the liquid crystal panel 1 are connected by using the FPC 4 which is connected to the thin film substrate 10B and which inputs the video signal. That is, the FPC 4 is provided with (i) a wire (not shown) for conducting the signal from the image-processing-block control section 33 and inputting the signal into the image-processing-block control section 33 and (ii) a connecting terminal part 4a connected to the wire. The connecting terminal part 4a is positioned in a middle portion of the FPC 4 and preferably in a bezel 3. Moreover, one end of another FPC 5 is connected to the image-processing substrate 31, and the other end of the FPC 5 is provided with a connecting terminal part 5a. The connecting terminal part 5a is connected (electrically and mechanically) to the connection terminal 4a in such a way that one facing surface is adhered to the other facing surface. Also in this case, the connection is performed by using a technique such as an ACF press bonding technique or a soldering technique.

Thus, by adopting the foregoing arrangement so as to provide the image-processing display device according to the present embodiment with the image-processing substrate 31 in addition to the liquid crystal panel 1, a multifunctional display device can be achieved by effectively using a limited space around the display element (herein referred to as "liquid crystal panel 1").

Figure 13:
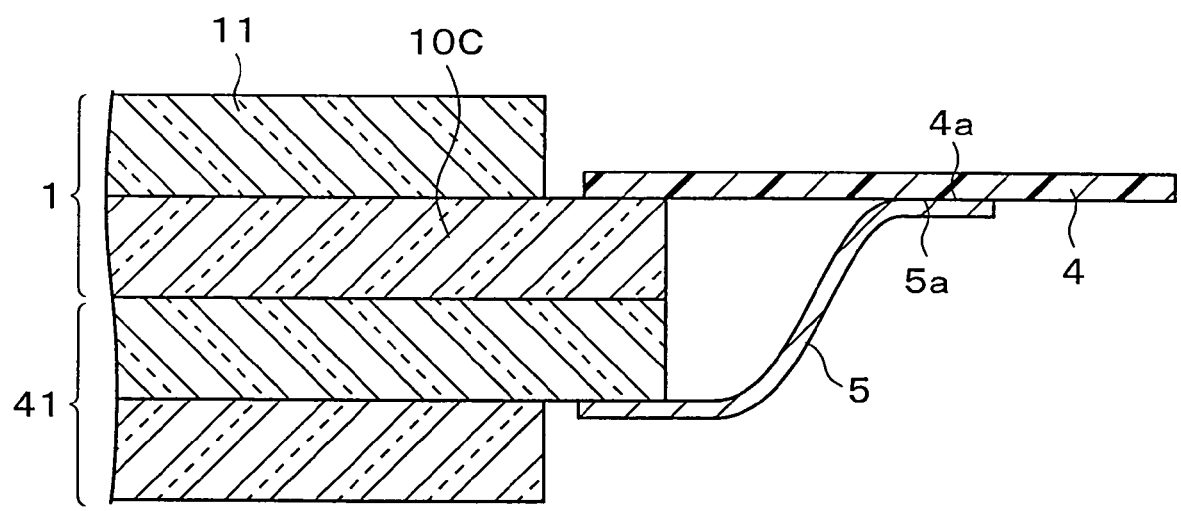
FIG. 13 is a cross-sectional view of a main portion of a two-display-element-equipped display device according to a fourth embodiment of the present invention.
Figure 14:
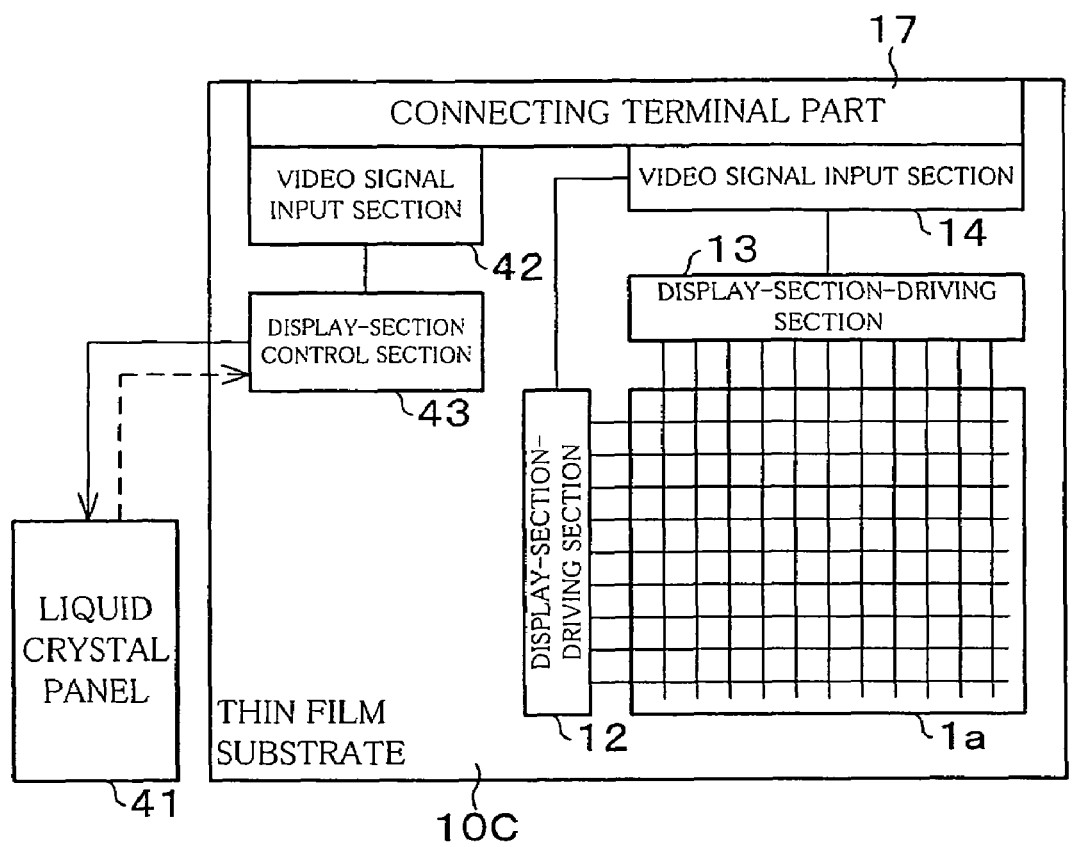
FIG. 14 is a functional image diagram of a thin film substrate of a liquid crystal panel mounted in the two-display-element-equipped display device.

FIG. 13 is a cross-sectional view of a main portion of a two-display-element-equipped display device according to a fourth embodiment of the present invention. This corresponds to the cross-sectional view in FIG. 2 of the foregoing sound-generating display device according to the first embodiment. Further, FIG. 14 is a functional image diagram of a thin film substrate 10C which is located in a liquid crystal panel 1 and which includes a circuit block of a display system of a liquid crystal panel 41. Note that, for the sake of convenience, components having the same functions as those described in the first embodiment are given the same reference numerals, and explanations thereof are omitted here.

The display device according to the present embodiment includes as a functional element the liquid crystal panel 41, which is different from the liquid crystal panel 1. Hereinafter, the liquid crystal panel 41 is referred to as "second liquid crystal panel 41." According to the present embodiment, the second liquid crystal panel 41 is disposed on a back surface of the liquid crystal panel 1 and mainly displays a background image. The second liquid crystal panel 41 for displaying the background image is separately provided, so that the liquid crystal panel preceding the second liquid crystal panel 41 no longer needs to process the background image so as to display object information serving as main information.

As illustrated in FIG. 14, the thin film substrate 10C of the liquid crystal panel 1 includes a circuit block of a display system and a circuit block of a separate system. The circuit block of the separate system includes a video signal input section 42 and a display-section control section 43. The circuit block of the separate system, as well as the circuit block of the display system, is formed by using a thin film layer.

The video signal input section 42 receives a background video signal and a display ON/OFF signal regarding the second liquid crystal panel 41 or generates a background video signal and a display ON/OFF signal based on the received signals. The display-section control section 43 receives the background video signal so as to output and stop outputting the background video signal to the second liquid crystal panel 41 based on the display ON/OFF signal received at the same time as the background video signal.

Moreover, also in the present embodiment, as illustrated more particularly in FIG. 13, the second liquid crystal panel 41 laminated on the liquid crystal panel 1 and the display-section control section 43 formed on the thin film substrate 10C of the liquid crystal panel 1 are connected by using the FPC 4 which is connected to the thin film substrate 10C and inputs the video signal. That is, the FPC 4 is provided with (i) a wire (not shown) for inputting the signal into the display-section control section 43 and (ii) a connecting terminal part 4a connected to the wire. The connecting terminal part 4a is positioned in a middle portion of the FPC 4 and preferably in a bezel 3. Moreover, one end of another FPC 5 is connected to the second liquid crystal panel 41, and the other end of the FPC 5 is provided with a connecting terminal part 5a. The connecting terminal part 5a is connected (electrically and mechanically) to the connection terminal 4a in such a way that one facing surface is adhered to the other facing surface. Also in this case, the connection is performed by using a technique such as an ACF press bonding technique or a soldering technique.

Thus, by adopting the foregoing arrangement so as to provide the display device according to the present embodiment with the second liquid crystal panel 41 in addition to the liquid crystal panel 1, a multifunctional display device can be achieved by effectively using a limited space around the display element (herein referred to as "liquid crystal panel 1").

Note that, in the future, if a thin film transistor is improved in terms of driving force, a driving circuit section (display-section-driving section) of a driver and other components driving the second liquid crystal panel 41 will be able to be incorporated, as a circuit block of the second liquid crystal panel 41, into the thin film substrate 10C of the liquid crystal panel 1. According to such an arrangement, the second liquid crystal panel 41 can be arranged at very low cost.

Figure 15:
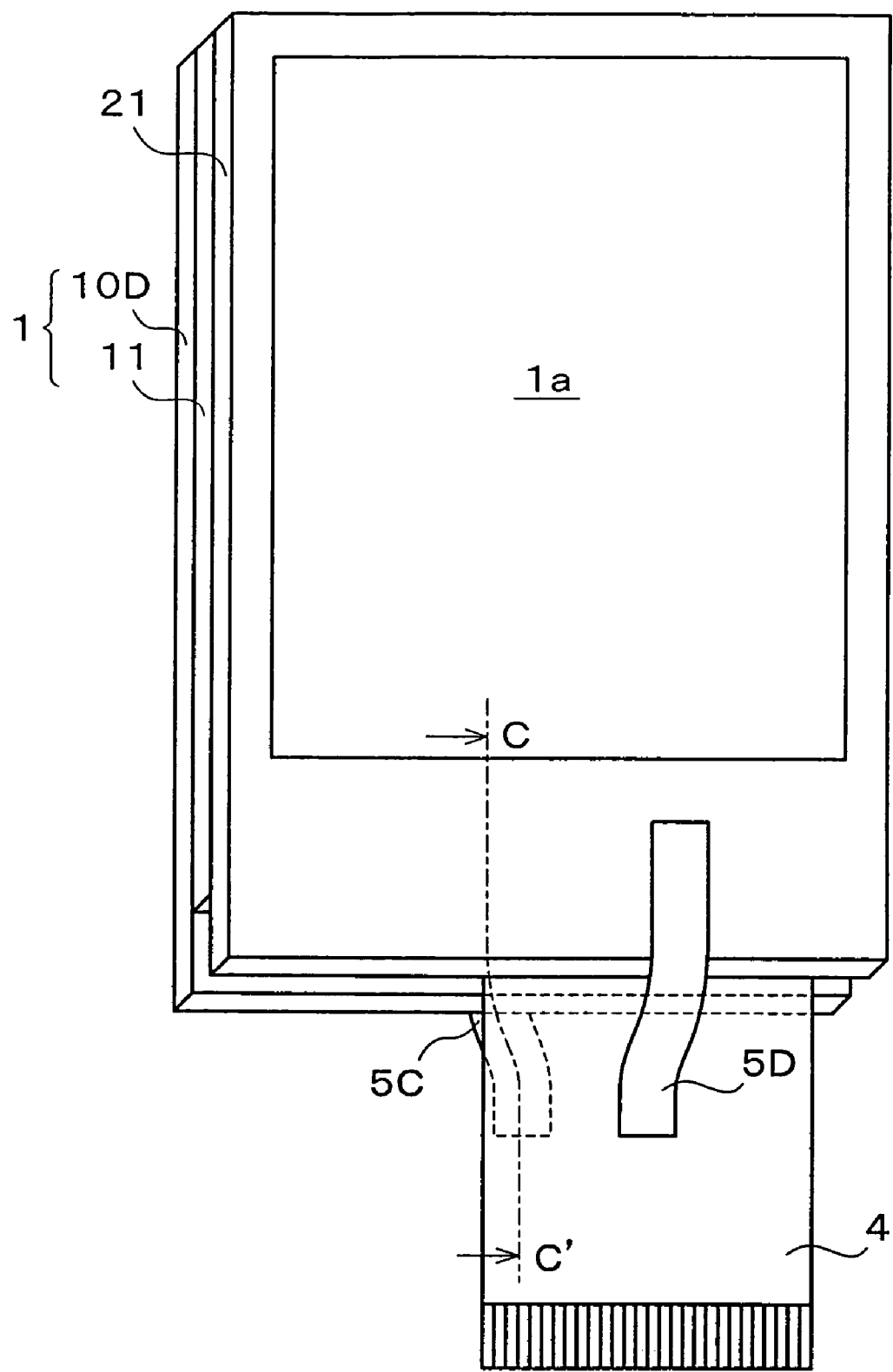
FIG. 15 is a perspective view illustrating an arrangement of a touch-panel-equipped sound-generating display device according to a fifth embodiment of the present invention.
Figure 16:
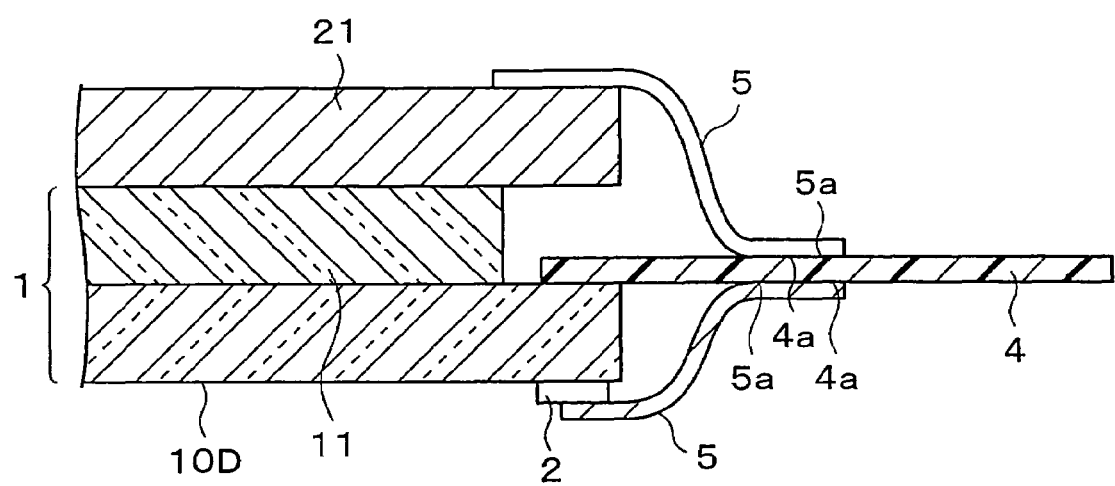
FIG. 16 is a cross-sectional view of the touch-panel-equipped sound-generating display device of FIG. 5 taken along a line C-C'.

FIG. 15 is a perspective view illustrating an arrangement of a touch-panel-equipped sound-generating display device, according to a fifth embodiment of the present invention, which includes a touch panel 21 and a voice device 2. FIG. 16 is a cross-sectional view of the touch-panel-equipped sound-generating display device of FIG. 15 taken along the line C-C'. Note that, for the sake of convenience, components having the same functions as those described in the first and second embodiments are given the same reference numerals, and explanations thereof are omitted here.

Although not illustrated in FIG. 15, the voice device 2 is laminated on a back surface of a liquid crystal panel 1. Further, although not particularly illustrated, a thin film substrate 10D of the liquid crystal panel 1 includes a circuit block of a display system, a circuit block of a voice system, and a circuit block of a touch panel system. The circuit block of the voice system and the circuit block of the touch panel system, as well as the circuit block of the display system, are formed by using a thin film layer.

The circuit block of the voice system on the thin film substrate 10D and the voice device 2 are connected by using the video-signal-inputting FPC 4 according to the same arrangement as that of the first embodiment. The circuit block of the touch panel system on the thin film substrate 10D and the touch panel 21 are connected by using the video-signal-inputting FPC 4 according to the same arrangement as that of the second embodiment. An audio signal is inputted into the circuit block of the voice system by using the video-signal FPC 4, and a position information signal is outputted from the circuit block of the touch panel system by using the video-signal-inputting FPC 4.

Note here that an FPC 5C to be connected to the voice device 2 is positioned on a back surface of the FPC 4, and an FPC 5D to be connected to the touch panel 21 is positioned on a surface of the FPC 4 under such conditions that the FPC 5C and the FPC 5D are placed out of alignment with each other. This applies to a case in which an inexpensive type of double-sided FPC is used. In this case, only one surface of the FPC 4 is provided with a wiring layer, and only when a wire needs to be drawn out to the other surface, is the wire drawn out to the other surface through a contact hole or the like. When both surfaces of the FPC 4 are provided with wiring layers, the FPC 5C and the FPC 5D can be placed in alignment with each other. In view of laminating more functional elements so as to achieve a more multifunctional display device, it is preferable that the video-signal-inputting FPC 4 be an FPC whose both surfaces are provided with wiring layers.

Figure 17:
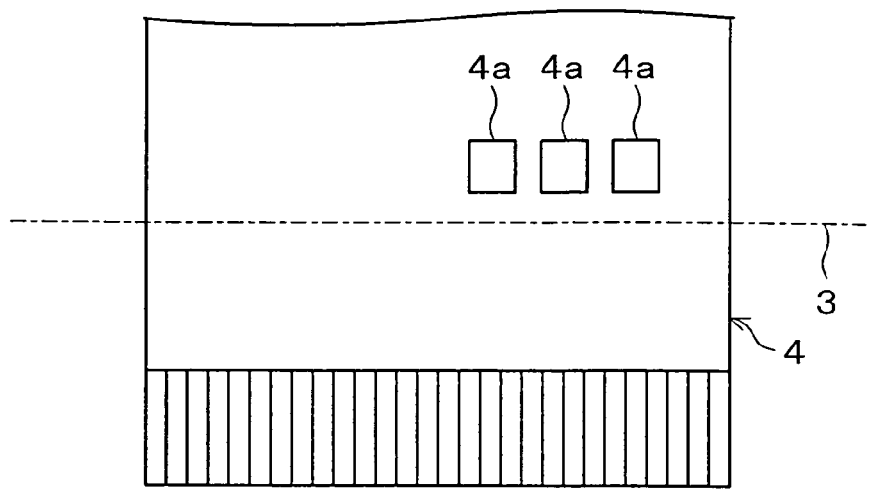
FIG. 17 is a plan view illustrating a state in which a plurality of connection terminals for enabling connection to functional elements are provided on a surface of an FPC connected to a thin film substrate.

Further, in the foregoing arrangement, a combination of the voice device 2 and the touch panel 21 is exemplified. However, the voice device 2 may be combined with the image-processing substrate 31, the second liquid crystal panel 41, or other functional elements. Further, when a plurality of functional elements are laminated on the same surface of the liquid crystal panel 1, a plurality of the foregoing connecting terminal part 4a are formed in the middle portion of the FPC 4 and may be provided in a row as illustrated in FIG. 17.

What is important will be described in the following. Each of the functional elements is laminated on the display element (herein referred to as "liquid crystal panel 1") so as to be confined in the planar area of the display element. The circuit block of the separate system, which circuit block processes the signal regarding the functional element, is formed directly on the thin film substrate 10. Exchange of signals between the circuit block of the separate system and the external device, and more preferably connection between the circuit block of the separate system and each function block, are carried out by using an essential FPC (herein referred to as "FPC 4") which is connected to the thin film substrate 10 and which carries out its other normal functions. The signal is transmitted through a surface of the FPC 4. In this way, a connection is made by eliminating a signal line connection which leads to an increase in the outer dimensions and thickness of a curved portion.

Figure 18:
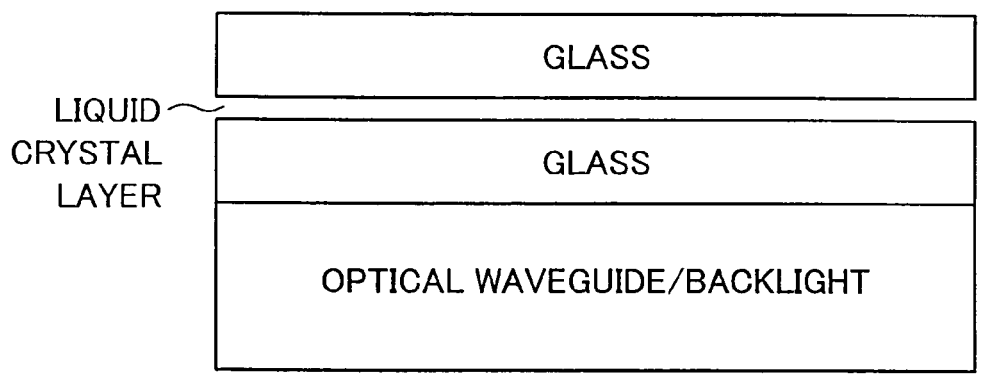
FIG. 18 is a cross-sectional view of a display section according to a transmissive liquid crystal display method.

In each of the foregoing embodiments, the liquid crystal panel 1 is exemplified as the display element. However, note that there are two types of liquid crystal display methods using the liquid crystal panel 1. One is a reflective type, and the other is a transmissive type. FIG. 18 is a cross-sectional view of a typical structure of a transmissive-type liquid crystal panel. Since the transmissive-type liquid crystal panel is provided with a backlight, the transmissive-type liquid crystal panel has a disadvantage in terms of thickness but has an advantage in terms of color reproducibility and contrast ratio.

Figure 19:
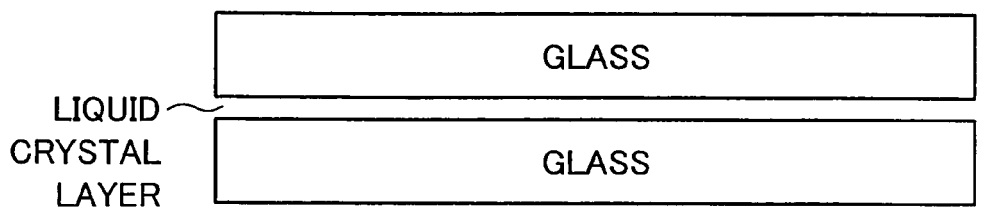
FIG. 19 is a cross-sectional view of a display section according to a reflective liquid crystal display method.

Meanwhile, FIG. 19 is a cross-sectional view of a typical structure of a reflective-type liquid crystal panel. As illustrated in FIG. 19, since the reflective-type liquid crystal panel only needs two glass substrates, the reflective-type liquid crystal panel can be made thin.

Figure 20:
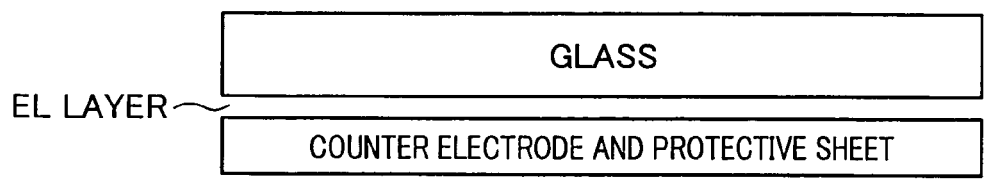
FIG. 20 is a cross-sectional view of a display section according to a method by which an EL element is used to perform display.

Further, the display element may be an EL (electroluminescence) element. FIG. 20 is a cross-sectional view of a typical structure of a display device using an EL element. In this method, since the display device only needs one glass substrate, the display device can be made thinner than in an arrangement using the liquid crystal panel 1.

Further, the display element may be a display element using a method for performing display by changing a state of diffusion or dispersion of an incident ray by controlling a movable pixel section by using a piezoelectric element, a micromachine, or the like. Alternatively, the display element may be a display element using an FED (field emission display) method.

Incidentally, in each of the foregoing embodiments, various signals including video signals are supplied to the thin film substrate 10 (10A to 10D) from the side of a host substrate serving as an external device to be connected through the FPC 4. (Note, however, that in the case of the touch panel 21, an output signal of the touch panel 21 is outputted as a position information signal to the host substrate, and in the case of the image-processing substrate 31, a post-processing return signal is returned to the host substrate.) The thin film substrate 10 (10A to 10D) positions a support substrate of the host substrate.

Exemplified as a sixth embodiment of the present invention is a display device including a liquid crystal panel 100 serving as a display device arranged such that a function of a host substrate is incorporated into a thin film substrate 101 of a liquid crystal panel 100 serving as a display element.

Figure 21:
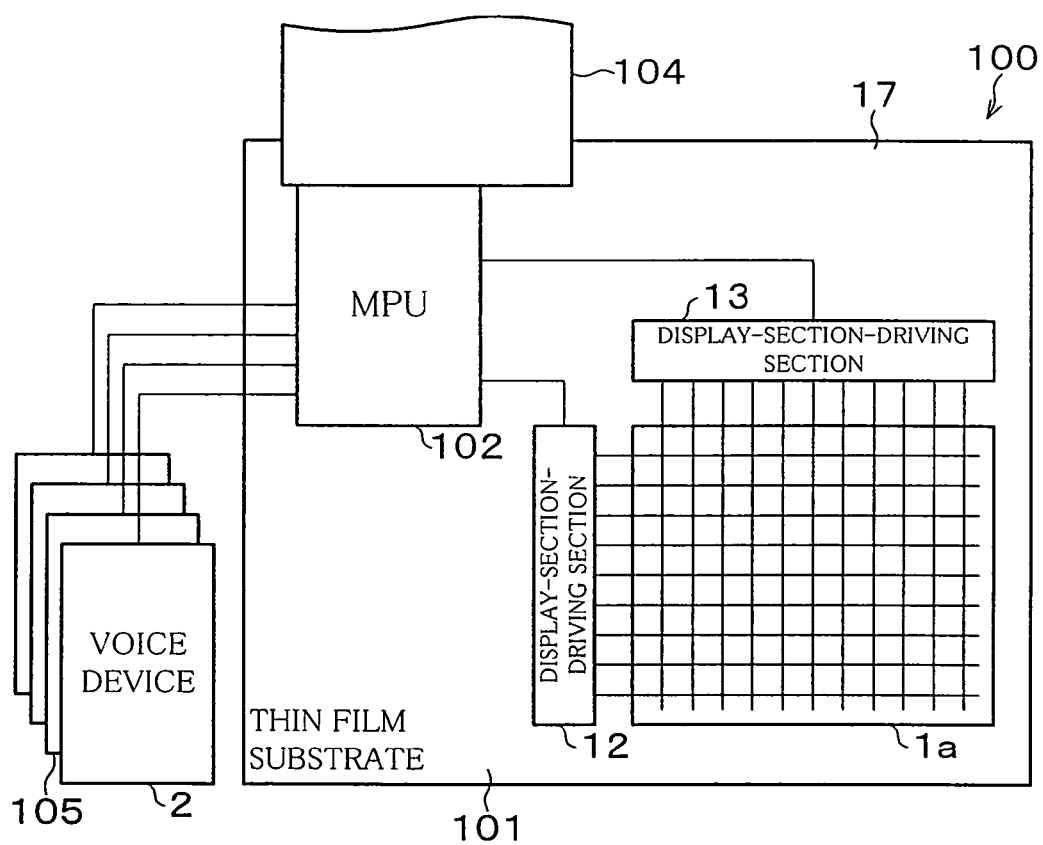
FIG. 21 is a functional image diagram of a thin film substrate of a liquid crystal panel mounted in an arithmetic processing display device according to a sixth embodiment of the present invention, the thin film substrate having the liquid crystal panel and an arithmetic processing device provided thereon.

FIG. 21 is a functional image diagram of the thin film substrate 101 of the liquid crystal panel 100 mounted on the display device according to the sixth embodiment.

Also in this case, the liquid crystal panel 100 using liquid crystal is exemplified as the display element. However, the display element is not to be limited to the liquid crystal panel.

As illustrated in FIG. 21, the display device includes, as functional elements, a voice device 2, a tuner 105 for receiving a wireless audio signal and a wireless video signal, and other functional elements, in addition to the liquid crystal panel 100. The functional elements are laminated so as to be confined in a planar area of the liquid crystal panel 100.

The liquid crystal panel 100 includes a pair of transparent substrates 101 and 11, such as glass substrates, with liquid crystal interposed therebetween. The substrate 101 includes, on a surface facing the substrate 11, a thin film layer containing a CGS (continuous grain silicon) thin film. The thin film layer is used to form a microprocessor (hereinafter referred to as "MPU") as well as a circuit element for driving a display section 1a of a pixel-driving TFT (thin film transistor) or the like. Note that an MPU is incorporated into a glass substrate by a CG silicon technique as described in detail in "*Nikkei Electronics* (Feb. 17, 2003) p. 123-130."

Thus, the MPU 102 is incorporated into the substrate of the liquid crystal panel 100. In this way, the tuner 105, which serves as a functional element in the display device and is laminated in the planar area of the liquid crystal panel 1, receives the audio signal and the video signal, and the signals are inputted into the MPU 102 so as to be processed. The video signal is supplied to display-section-driving sections 12 and 13 forming a circuit block of a display section. The audio signal is processed to be a signal capable of driving the voice device 2 and then outputted to the voice device 2.

Moreover, also in the present embodiment, as with each of the foregoing embodiments, the MPU 102 is connected to the voice device 2, the tuner 105, and the other plural functional elements by using an FPC 104 to be connected to a connecting terminal part 17 of the thin film substrate 101. A middle portion of the FPC 104 is provided with a connecting terminal part for enabling connection to various devices. One end of the FPC 104 is connected to the voice device 2, the tuner 105, and the other plural functional elements, and the other end of the FPC 104 is connected to the MPU 102. This enables simple and inexpensive connection and ensures high reliability. Note, however, that the FPC 104 in this case conducts to an external device the signals processed at the MPU 102.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention can be applied to various mobile apparatuses and display devices of very easily portable card-type apparatuses about the size of cards or business cards.

The invention claimed is:

1. A display device, comprising:
a display element having a display function; and
a functional element having a function different from that of the display element; wherein:
the functional element is laminated on the display element so as to be confined in a planar area of the display element; and
the display element includes a thin film substrate;
the thin film substrate has provided directly thereon:
   a circuit block of a display system that is arranged to process an externally inputted video signal so as to drive the display section and that includes a plurality of transistors arranged in an array to control corresponding pixels of the display element; and
   a circuit block of a separate system that is arranged to process a signal regarding the functional element; and
the circuit block of the separate system receives and sends the signal through a flexible printed circuit board which is connected to the thin film substrate and which enables connection to an external device.

2. The display device according to claim 1, wherein the circuit block of the separate system on the display element, and the functional element to be laminated on the display element, are connected through (i) a first printed circuit board, which is said printed circuit board for connecting the display element to the external device, and (ii) a second flexible printed circuit board, a first end of which is connected to the functional element and a second end of which is connected to a middle portion of the first printed circuit board.

3. The display device according to claim 1, wherein the printed circuit board for connecting the display element to the external device inputs the video signal into the display element.

4. The display device according to claim 1, wherein:
a plurality or plural types of said functional element are provided, and
said thin film substrate is provided with a plurality or plural types of circuit blocks of separate systems corresponding to the plurality or plural types of said functional element.

5. The display device according to claim 1, wherein:
said functional element is either a sound source element for generating a sound corresponding to an audio signal or a sound collection element for collecting a voice so as to convert the voice into the audio signal, or
when the plurality or plural types of said functional element are provided, at least one of the plurality or plural types of said functional element is either the sound source element or the sound collection element.

6. The display device according to claim 1, wherein:
said functional element is a touch panel which is disposed on a side of a display surface of the display element and which outputs a signal corresponding to an input position of an operator, or
when the plurality or plural types of said functional element are provided, at least one of the plurality or plural types of said functional element is the touch panel.

7. The display device according to claim 1, wherein:
said functional element is an image-processing substrate which is disposed on a side of a back surface of the display element and which subjects the video signal to image processing based on an externally inputted control signal, or
when the plurality or plural types of said functional element are provided, at least one of the plurality or plural types of said functional element is the image-processing substrate.

8. The display device according to claim 1, wherein:
said functional element is a separate display element to be laminated on the display element, or
when the plurality or plural types of said functional element are provided, at least one of the plurality or plural types of said functional element is the separate display element.

9. The display device according to claim 1, wherein the thin film substrate has a thin film layer including a polycrystalline silicon thin film.

10. The display device according to claim 1, wherein the thin film substrate has a thin film layer including a continuous grain boundary silicon thin film.

11. The display device according to claim 1, wherein the display element performs display by using a liquid crystal.

12. The display device according to claim 1, wherein the display element performs display by using an EL layer.

* * * * *